United States Patent
Gu et al.

(10) Patent No.: US 10,755,918 B2
(45) Date of Patent: Aug. 25, 2020

(54) SPACER WITH LAMINATE LINER

(71) Applicant: GLOBALFOUNDRIES INC., Grand Cayman (KY)

(72) Inventors: Man Gu, Malta, NY (US); Tao Han, Clifton Park, NY (US); Charlotte D. Adams, Schenectady, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 16/193,313

(22) Filed: Nov. 16, 2018

(65) Prior Publication Data
US 2020/0161122 A1 May 21, 2020

(51) Int. Cl.
*H01L 29/66* (2006.01)
*H01L 21/02* (2006.01)
*H01L 21/311* (2006.01)

(52) U.S. Cl.
CPC ...... *H01L 21/022* (2013.01); *H01L 21/02118* (2013.01); *H01L 21/31116* (2013.01); *H01L 21/31144* (2013.01); *H01L 29/6653* (2013.01); *H01L 29/6656* (2013.01); *H01L 29/66545* (2013.01)

(58) Field of Classification Search
CPC .......... H01L 29/6653; H01L 29/66545; H01L 29/6656
USPC ....................................................... 257/900
See application file for complete search history.

(56) References Cited

U.S. PATENT DOCUMENTS

| | | | |
|---|---|---|---|
| 6,869,893 B2 | 3/2005 | Reder et al. | |
| 7,132,704 B2* | 11/2006 | Grudowski | H01L 21/26586 257/288 |
| 7,659,561 B2* | 2/2010 | Kwon | H01L 29/4983 257/213 |
| 8,859,430 B2 | 10/2014 | Chiba | |
| 2006/0220152 A1 | 10/2006 | Huang et al. | |
| 2010/0065922 A1* | 3/2010 | Han | H01L 21/76232 257/384 |
| 2018/0197970 A1* | 7/2018 | Pan | H01L 21/31144 |

\* cited by examiner

*Primary Examiner* — Matthew E Warren
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to a spacer with laminate liner and methods of manufacture. The structure includes: a replacement metal gate structure; a laminate low-k liner on the replacement metal gate structure; and a spacer on the laminate low-k liner.

20 Claims, 2 Drawing Sheets

SPACER WITH LAMINATE LINER

FIELD OF THE INVENTION

The present disclosure relates to semiconductor structures and, more particularly, to a spacer with laminate liner and methods of manufacture.

BACKGROUND

Integration of low-k materials as a sidewall spacer is a key challenge for smaller technology nodes. For example, a profound fail mode is associated with low-k spacer damage which occurs from post poly pull cleaning processes in replacement gate processes. In this fail mode, the low-k erosion at the top part of gate results in a taper profile that heavily degrades metal gate height variability, while hurting the short margin between the source/drain contact and the gate metal. In essence, this fail mode has prevented implementation of lower-k spacer to further boost device performance.

SUMMARY

In an aspect of the disclosure, a structure comprises: a replacement metal gate structure; a laminate low-k liner on the replacement metal gate structure; and a spacer on the laminate low-k liner.

In an aspect of the disclosure, a structure comprises: a replacement metal gate structure; a laminate low-k dielectric liner composed of alternating materials, directly on a sidewall of the replacement metal gate structure; and a low-k dielectric spacer directly on the laminate liner.

In an aspect of the disclosure, a method comprises: forming a dummy gate structure; depositing a laminate low-k dielectric liner composed of alternating materials on the dummy gate structure; depositing a low-k dielectric spacer on the laminate low-k dielectric liner; and replacing the dummy gate structure with a replacement metal gate structure such that sidewall of the replacement metal gate structure is lined with the laminate low-k dielectric liner.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a spacer with laminate liner and methods of manufacture. More specifically, the present disclosure is directed to a spacer using a robust laminate low-k liner. The spacer and low-k liner can be used with FinFET devices. Advantageously, the spacer with the laminate low-k liner enables more robust spacer profile for downstream process variability reduction, e.g., downstream replacement gate processes.

In embodiments, the use of the spacer with the robust laminate low-k liner provides significant improvement in spacer profile incoming to a replacement metal gate structure. In addition, the spacer with the robust laminate low-k liner provides a significant reduction in metal gate height variability and source/drain contact (TS) to gate metal (PC) shorts. In addition, the lower-k spacer and sidewall structure will boost device performance, while opening the possibilities to enable weaker materials with lower-k value as sidewall spacers on the gate structure.

The spacer with laminate liner of the present disclosure can be manufactured in a number of ways using a number of different tools. In general, though, the methodologies and tools are used to form structures with dimensions in the micrometer and nanometer scale. The methodologies, i.e., technologies, employed to manufacture the spacer with laminate liner of the present disclosure have been adopted from integrated circuit (IC) technology. For example, the structures are built on wafers and are realized in films of material patterned by photolithographic processes on the top of a wafer. In particular, the fabrication of the spacer with laminate liner uses three basic building blocks: (i) deposition of thin films of material on a substrate, (ii) applying a patterned mask on top of the films by photolithographic imaging, and (iii) etching the films selectively to the mask.

Figure 1:
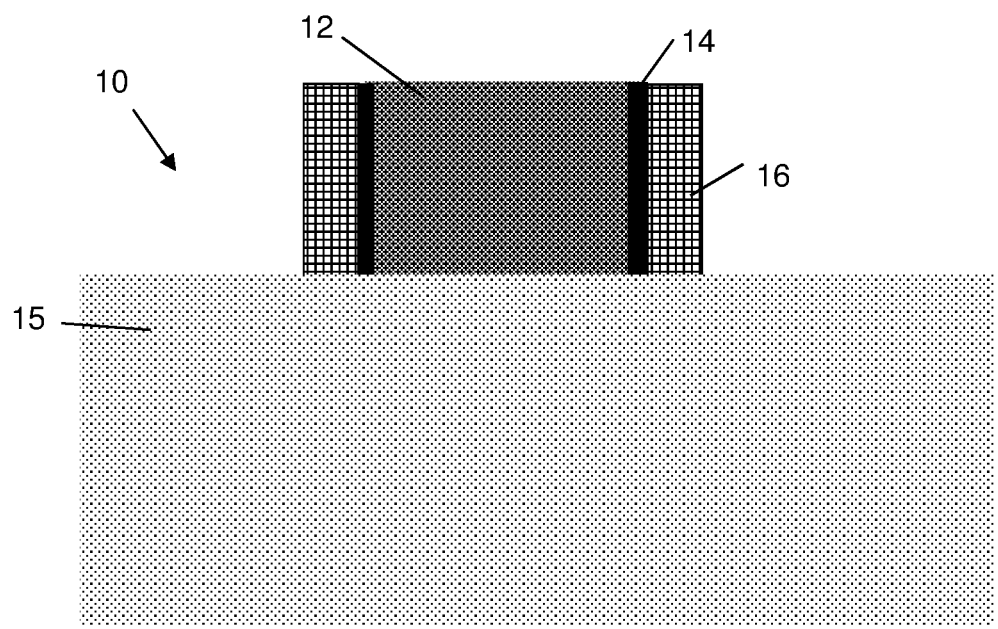
FIG. 1 shows a gate structure comprising a spacer with laminate liner, amongst other features, and respective fabrication processes in accordance with aspects of the present disclosure.

FIG. 1 shows a gate structure comprising a spacer with laminate liner, amongst other features, and respective fabrication processes. In embodiments, the structure 10 of FIG. 1 includes a replacement metal gate structure 12. The replacement metal gate structure 12 can be fabricated over a fin structure 15 used in FinFET technologies.

The replacement metal gate structure 12 includes a laminate low-k dielectric liner 14 composed of a multiple layers of materials, e.g., alternating low-k dielectric material and SiCN. A spacer material 16 is deposited directly over the laminate liner 14. In embodiments, the laminate liner 14 is approximately 1 nm in thickness and the spacer material 16 is about 6 nm to 10 nm in thickness. The spacer material 16 can be a film of SiOCN, for example, deposited in an in-situ process. In other implementations, the spacer material 16 can be other low-k dielectric spacer materials, e.g., SiBCN.

Figure 2:
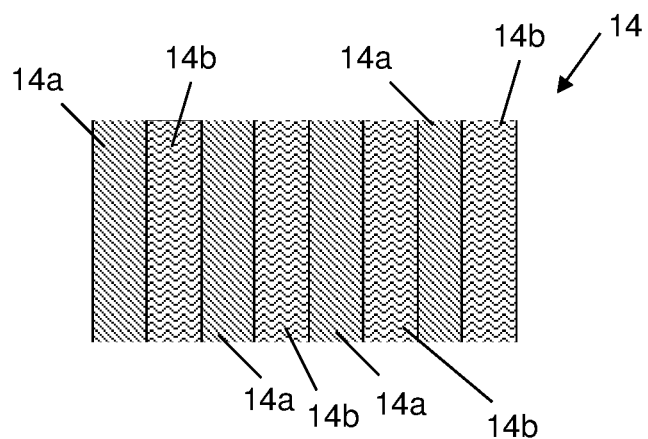
FIG. 2 shows the laminate liner and respective fabrication processes in accordance with aspects of the present disclosure.

FIG. 2 shows the laminate liner 14 in accordance with aspects of the present disclosure. As shown in FIG. 2, the laminate low-k dielectric liner 14 includes alternate layers of material 14a, 14b. In embodiments, the material 14a can be SiOCN or SiOC (or other low-k dielectric materials), as examples, deposited to a total thickness of approximately 1 Å. In further embodiments, the material 14a can be other oxygen rich or carbon rich Si based materials, with a low-k value, e.g., 5.2 K or lower, as an example. The material 14b, on the other hand, is SiCN deposited to a thickness of about 1.5 Å. In further embodiments, the thickness of each of the materials 14a, 14b can be between about 1 Å to 2 Å.

The structure shown in FIG. 1 can be fabricated using conventional replacement gate processes. First, in FinFET technologies, the fin structure 15 can be fabricated using sidewall image transfer (SIT) techniques or other conventional patterning processes. In an example of a SIT technique, a mandrel material, e.g., $SiO_2$, is deposited on semiconductor material using conventional chemical vapor deposition (CVD) processes. A resist is formed on the mandrel material, and exposed to light to form a pattern (openings). A reactive ion etching (RIE) is performed through the openings to form the mandrels. Spacers are formed on the sidewalls of the mandrels which are preferably material that is different than the mandrels, and which are formed using conventional deposition processes known to those of skill in the art. The spacers can have a width which matches the dimensions of the narrow fin structures, for example. The mandrels are removed or stripped using a conventional etching process, selective to the mandrel material. An etching is then performed within the spacing of the spacers to form the sub-lithographic semiconductor features, e.g., fin structures 15. The sidewall spacers can then be stripped.

Following fin formation, dummy gate material can be deposited and patterned using conventional lithography and etching processes. For example, a poly material can be deposited over the fin structures using a conventional deposition process, e.g., CVD. A resist formed over the poly material is exposed to energy (light) to form a pattern (opening). An etching process with a selective chemistry, e.g., RIE, will be used to pattern the poly material. The resist can then be removed by a conventional oxygen ashing process or other known stripants.

Alternating liner materials 14a, 14b and spacer material 16 are deposited over the patterned poly material. In embodiments, the alternating materials 14a, 14b can be deposited using three (3) to five (5) deposition cycles and, more preferably, four (4) deposition cycles, e.g., atomic layer deposition (ALD) process. The alternating liner materials 14a, 14b and spacer material 16 on top of the fin structures and the substrate are removed by an anisotropic etching process.

Following the anisotropic process and epitaxial formation process, an interlevel dielectric material is deposited over the dummy gate structures. The interlevel dielectric material can be an oxide material deposited using a CVD process. The interlevel dielectric material is planarized using a chemical mechanical polish (CMP) to expose the poly material, which is removed, e.g., pulled, by a selective etching process. The alternating liner materials 14a, 14b and spacer material 16 will remain after the removal of the poly material. Replacement gate material is then deposited within the opening between the alternating liner materials 14a, 14b and spacer material 16, formed by the removal of the poly material. In embodiments, the metal gate material can be a high-k dielectric material, a metal workfunction metal, e.g., tungsten and a capping material, e.g., nitride.

Table 1 shows a comparison of materials undergoing an etching process with 100:1 dHF for 30 seconds, 60 seconds and 90 seconds. As shown in table 1 below, the laminate liner described herein, e.g., labeled "new" in the table, shows the lowest film loss for dHF for 30 seconds, 60 seconds and 90 seconds, compared to SiOCN, SiN or SiCN, alone.

TABLE 1

| Film Loss (A) | dHF 30 s | dHF 60 s | dHF 90 s |
| --- | --- | --- | --- |
| New | 2.5 | 2.9 | 3.2 |
| SiOCN | 4.3 | 5.2 | 5.8 |
| SiN | 3.7 | 5.7 | 7.5 |
| SiCN | 3.0 | 3.3 | 3.4 |

Figure 3:
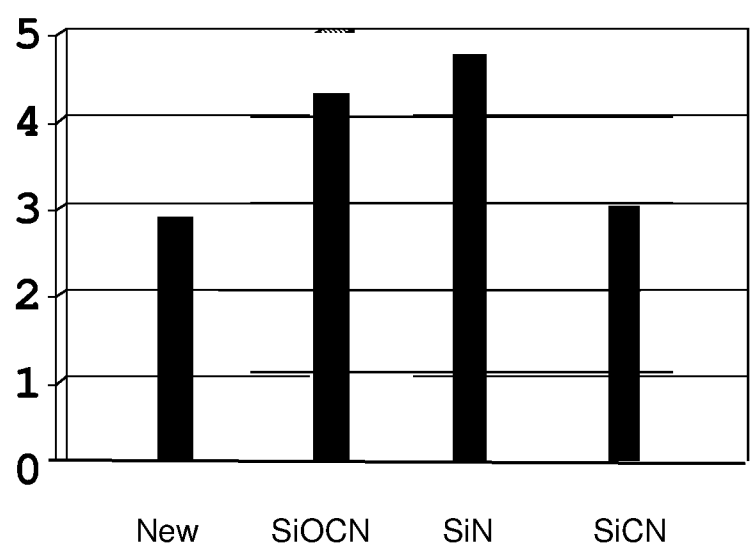
FIG. 3 shows a comparison graph of materials undergoing an etching process with SiCoNi for 9 seconds targeted for removal of 40 Å thermally grown $SiO_2$.

FIG. 3 shows a comparison graph of materials undergoing an etching process with SiCoNi for 9 seconds targeted for removal of 40 Å thermally grown $SiO_2$. In FIG. 3, the x-axis represents different materials and the y-axis represents film loss during SiCoNi etching process (measured in Å). As shown in the graph of FIG. 3, the laminate liner described herein, e.g., labeled "new" in the graph, shows the lowest film loss for a SiCoNi etchant, compared to SiOCN, SiN or SiCN, alone.

Table 2, below, shows a comparison of material plasma-induced damage depth due to $N_2H_2$ and $O_2/N_2H_2$ ashing processes (measured in Å). As shown in Table 2, although the liner material described herein, e.g., labeled "new" in the table, exhibits the second lowest damage depth with the ashing process, it does provide lower dielectric constant compared to SiN or SiCN, alone. The liner material, which has the dielectric constant closest to SiOCN, will provide for increase device performance, while still providing an acceptable damage depth of material during the ashing processes.

TABLE 2

| Damage Depth (A) | $N_2H_2$ | $O_2/N_2H_2$ |
| --- | --- | --- |
| New | 7.4 | 17.8 |
| SiOCN | 12.9 | 23.8 |
| SiN | 10.0 | 18.0 |
| SiCN | 6.5 | 14.5 |

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a replacement metal gate structure;
   a laminate low-k dielectric liner on the replacement metal gate structure, the laminate low-k dielectric liner comprising multiple sets of alternating materials where each layer of the multiple sets of alternating materials comprises a thickness of between about 1 Å to 2 Å; and
   a spacer on the laminate low-k liner.

2. The structure of claim 1, wherein the laminate low-k dielectric material is composed of two different materials.

3. The structure of claim 2, wherein the two different materials is a low-k dielectric material alternating with SiCN.

4. The structure of claim 3, wherein the two different materials are SiOCN and SiCN.

5. The structure of claim 3, wherein the two different materials are SiOC and SiCN.

6. The structure of claim 3, wherein the two different materials are alternating with three to five deposition cycles.

7. The structure of claim 6, wherein the two different materials are alternating with four deposition cycles.

8. The structure of claim 3, wherein the two different materials have a total thickness of about 1 nm.

9. The structure of claim 3, wherein the replacement gate structure is a FinFET gate structure.

10. The structure of claim 3, wherein the two different materials have a slower etch rate in 100:1 dHF than a single dielectric material alone.

11. The structure of claim 10, wherein the single dielectric is SiOCN, SiN or SiCN.

12. The structure of claim 1, wherein a first layer of material of a first set of the multiple sets of alternating materials is directly contacting the replacement metal gate structure and a last layer of material of a last set of the multiple sets of the alternating materials is directly contacting the spacer.

13. The structure of claim 12, wherein the replacement metal gate structure comprises a high-k dielectric material, a metal workfunction metal and a SiN capping material and the multiple sets of alternating materials each are composed of SiOCN or SiOC alternating with SiCN.

14. A structure, comprising:
a replacement metal gate structure;
a laminate low-k dielectric liner composed of at least two sets of alternating materials composed of different material layers, directly on a sidewall of the replacement metal gate structure; and
a low-k dielectric spacer directly on the laminate liner.

15. The structure of claim 14, wherein the two alternating materials are SiOCN and SiCN.

16. The structure of claim 14, wherein the two alternating material are SiOC and SiCN.

17. The structure of claim 14, wherein the two alternating materials each have a thickness of between about 1 Å to 2 Å, with a total thickness of about 1 nm.

18. The structure of claim 14, wherein the replacement gate structure is a FinFET gate structure.

19. The structure of claim 14, wherein the two different materials have a slower etch rate in 100:1 dHF than a single dielectric material of SiOCN, SiN or SiCN.

20. The structure of claim 14, wherein a first layer of material of a first set of the at least two sets of alternating materials is directly contacting the replacement metal gate structure and a last layer of material of a last set of the at least two sets of alternating materials is directly contacting the spacer.

* * * * *